(12) United States Patent
Miyatake

(10) Patent No.: US 7,035,482 B2
(45) Date of Patent: Apr. 25, 2006

(54) SOLID-SATE IMAGE-SENSING DEVICE

(75) Inventor: Shigehiro Miyatake, Osaka (JP)

(73) Assignee: Minolta Co., Ltd., Osaka (JP)

( * ) Notice: Subject to any disclaimer, the term of this patent is extended or adjusted under 35 U.S.C. 154(b) by 663 days.

(21) Appl. No.: 10/256,887

(22) Filed: Sep. 27, 2002

(65) Prior Publication Data
US 2003/0062583 A1   Apr. 3, 2003

(30) Foreign Application Priority Data
Oct. 1, 2001   (JP)   ............................. 2001-305462

(51) Int. Cl.
*G06K 7/00*   (2006.01)
*G06K 9/20*   (2006.01)

(52) U.S. Cl. ...................... 382/312; 382/324; 348/294; 348/300; 257/444

(58) Field of Classification Search ............. 250/208.1, 250/205, 202, 201.1; 235/439, 440, 435, 235/477, 476, 472.1; 358/482, 483, 475, 358/474, 513, 473; 348/230.1, 302, 301, 348/308, 300, 294; 257/431, 444, 443; 382/324, 382/321, 318, 317, 315, 313, 312
See application file for complete search history.

(56) References Cited

U.S. PATENT DOCUMENTS

| | | | |
|---|---|---|---|
| 4,942,474 A | 7/1990 | Akimoto et al. | ....... 358/213.11 |
| 5,241,575 A | 8/1993 | Miyatake et al. | ............. 377/60 |
| 5,694,495 A * | 12/1997 | Hara et al. | ................... 382/324 |
| 5,898,168 A | 4/1999 | Gowda et al. | ........... 250/208.1 |
| 6,239,839 B1 | 5/2001 | Matsunaga et al. | ......... 348/308 |
| 6,521,926 B1 * | 2/2003 | Sasaki | ........................ 257/292 |
| 6,798,451 B1 * | 9/2004 | Suzuki et al. | ................ 348/294 |

FOREIGN PATENT DOCUMENTS

JP   10-093066 A   4/1998

* cited by examiner

*Primary Examiner*—Sanjiv Shah
*Assistant Examiner*—Ali Bayat
(74) *Attorney, Agent, or Firm*—Sidley Austin LLP

(57) ABSTRACT

Each unit pixel has a photodiode PD, an amplifying MOS transistor T1 having its gate connected to the cathode of the photodiode PD, and a MOS transistor T2 having its source connected to the node between the photodiode PD and the gate of the MOS transistor T1. Forming only two MOS transistors other than a photodiode PD functioning as a photoelectric converter helps improve the open-area ratio.

19 Claims, 11 Drawing Sheets

F I G. 1
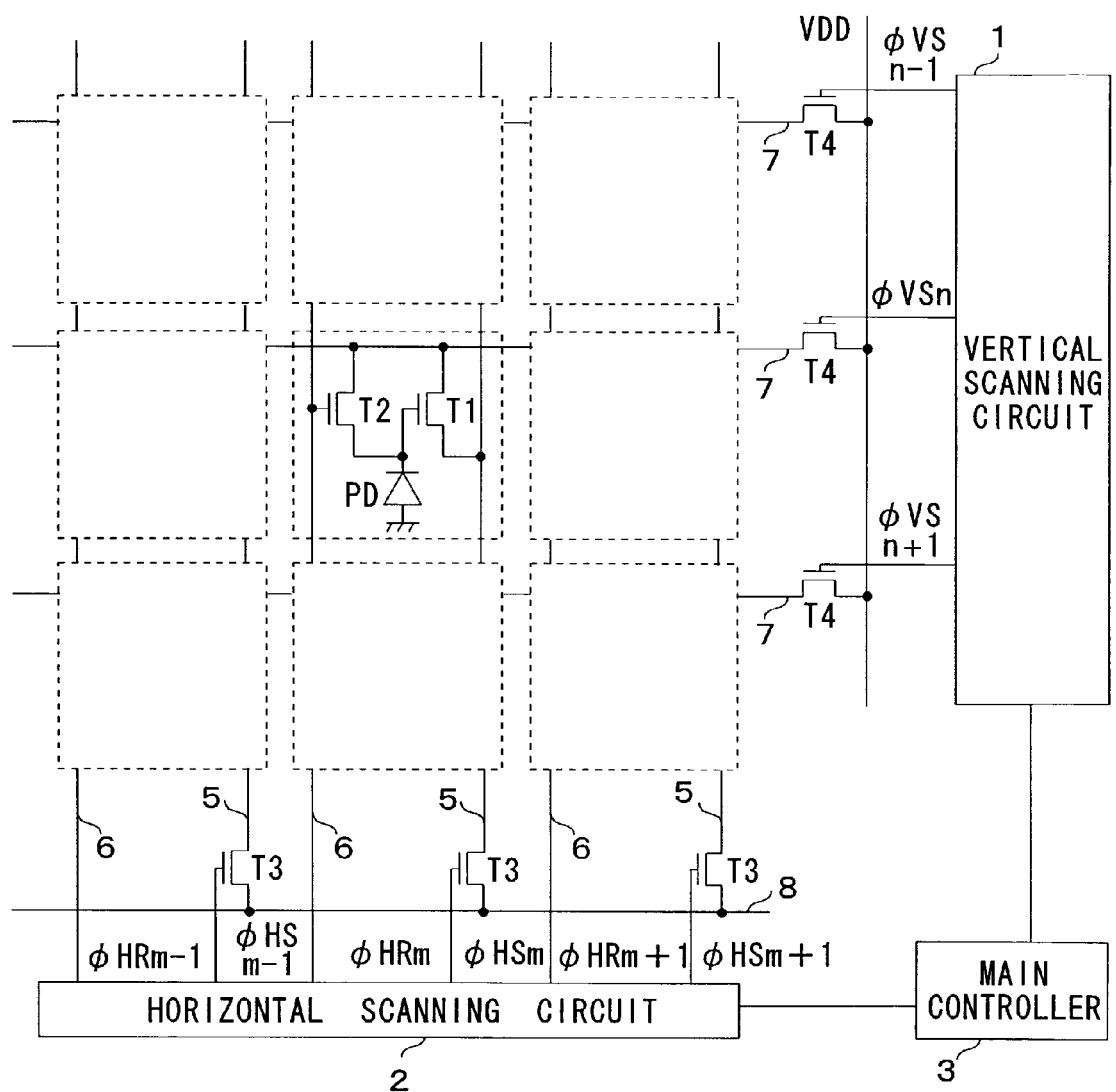
F I G. 2
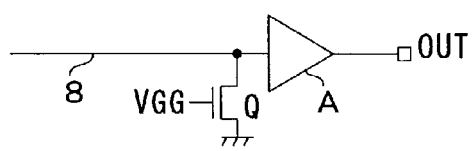

F I G. 1 1
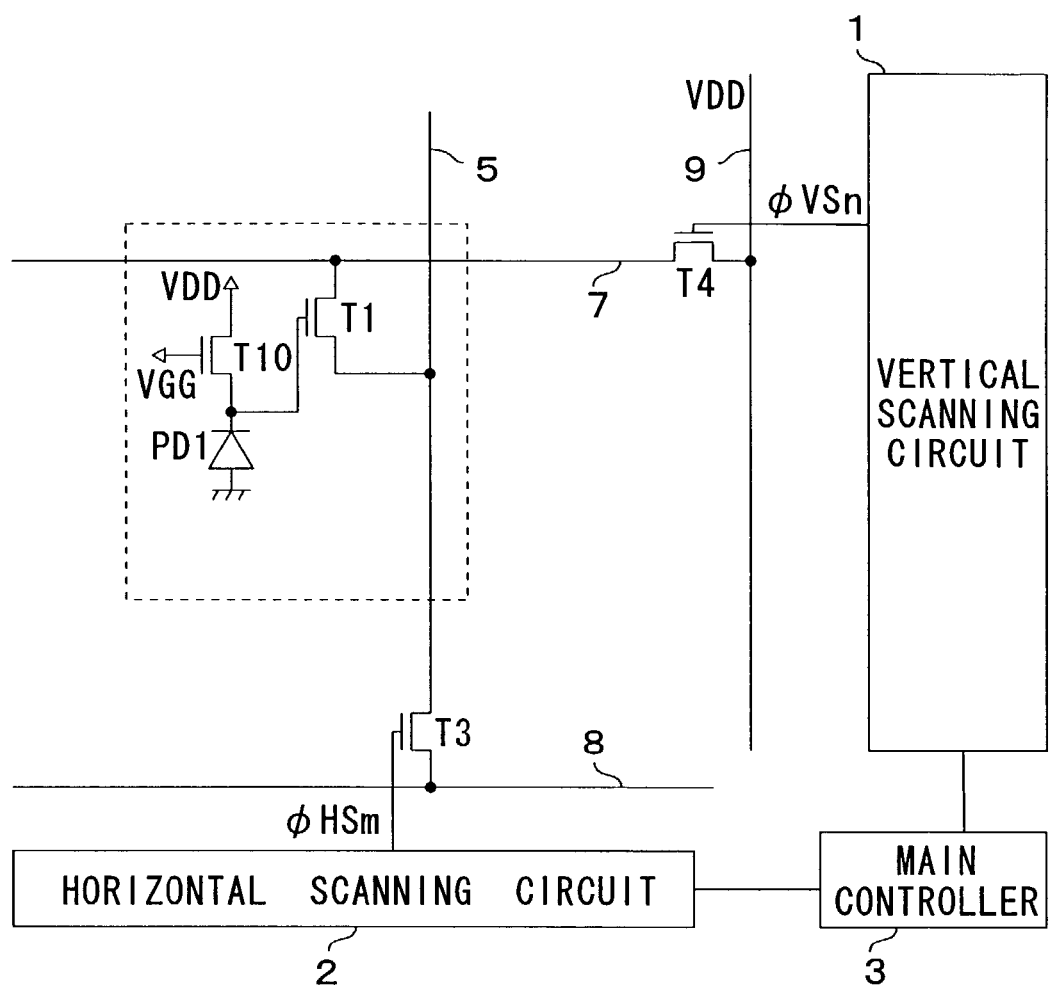

F I G. 1 2
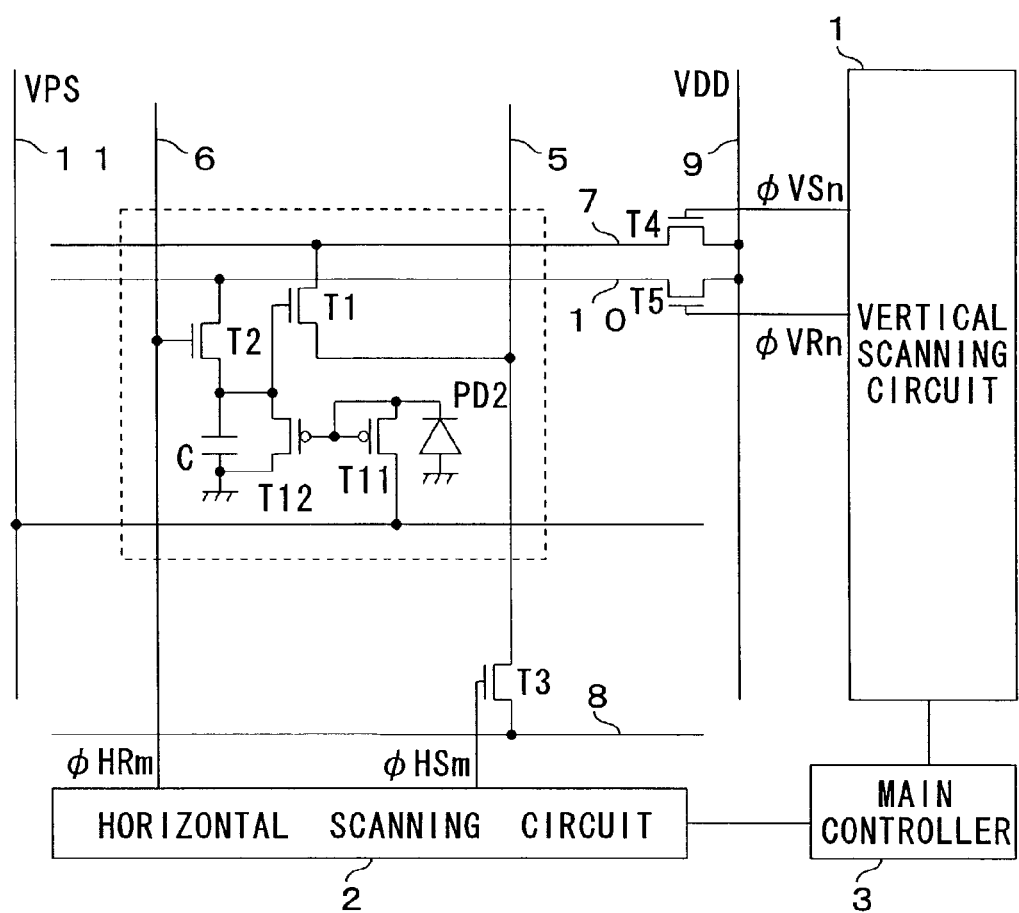

F I G. 1 3
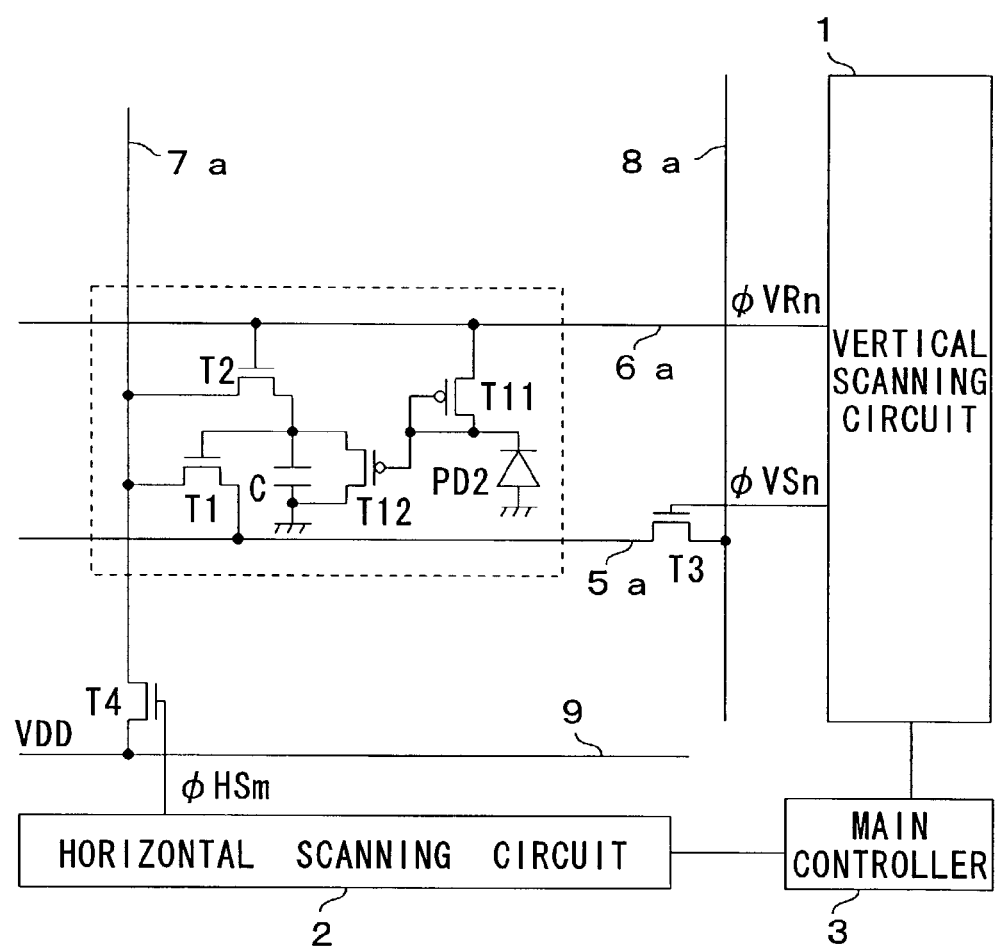

SOLID-SATE IMAGE-SENSING DEVICE

This application is based on Japanese Patent Application No. 2001-305462 filed on Oct. 1, 2001, the contents of which are hereby incorporated by reference.

BACKGROUND OF THE INVENTION

1. Field of the Invention

The present invention relates to a solid-state image-sensing device, and more particularly to a solid-state image-sensing device of which each pixel is provided with an amplifying function.

2. Description of the Prior Art

Two-dimensional solid-state image-sensing devices are used in various applications. A two-dimensional solid-state image-sensing device has a large number of pixels arranged in a matrix (an array consisting of a plurality of rows and columns), and each of those pixels includes a photoelectric conversion element (photosensitive element) such as a photodiode and a means for transferring the photoelectric charge generated in it to an output signal line. Such solid-state image-sensing devices are classified roughly into a CCD type and a MOS type, according to the type of the means they use to read out (extract) the photoelectric charges generated in photoelectric conversion elements. CCD-type solid-state image-sensing devices transfer the photoelectric charges while accumulating them in potential wells, and have the disadvantage of narrow dynamic ranges. On the other hand, MOS-type solid-state image-sensing devices directly read out the electric charges accumulated in the pn-junction capacitance of photodiodes through MOS transistors.

FIG. 14 shows a conventionally known configuration of the latter type of solid-state image-sensing device. The solid-state image-sensing device shown in FIG. 14 includes a vertical scanning circuit 100 that performs scanning along the columns (in the vertical direction) by feeding, for one column after another, a signal φVRn and a signal φVSn to one of a plurality of reset lines 102 and one of a plurality of vertical selection lines 103, respectively, and a horizontal scanning circuit 101 that performs scanning along the rows (in the horizontal direction) by feeding, for one row after another, a signal φHm to the gate of a MOS transistor Td whose drain is connected to one of a plurality of horizontal scanning lines 104.

In this solid-state image-sensing device, each pixel, i.e., a unit pixel, is composed of a photodiode PD functioning as a photoelectric conversion element, an N-channel MOS transistor Ta having its gate connected to the cathode of the photodiode PD, an N-channel MOS transistor Tb having its source connected to the cathode of the photodiode PD, and an N-channel MOS transistor Tc having its drain connected to the source of the MOS transistor Ta. That is, the solid-state image-sensing device shown in FIG. 14 has a plurality of pixels each composed of MOS transistors Ta, Tb, and Tc and a photodiode PD. It is to be noted that, in FIG. 14, for simplicity's sake, only one pixel, in the nth row and mth column, is shown.

In this solid-state image-sensing device, the anode of the photodiode PD is grounded, and a direct-current voltage VDD is applied to the drains of the MOS transistors Ta and Tb. The gates of the MOS transistors Tb and Tc are connected to the reset line 102 and the vertical selection line 103, respectively. The source of the MOS transistor Td is connected to a horizontal signal line 105, so that an image signal is fed out by way of the horizontal signal line 105 via an output terminal OUT.

In the solid-state image-sensing device configured as described above, first, a high level is fed, as the signal φVSn, to the vertical selection line 103, so that the MOS transistor Tc is turned on. This causes a voltage commensurate to the amount of light incident on the photodiode PD to appear at the gate of the MOS transistor Ta. This causes an amplified current commensurate to the voltage appearing at the gate of the MOS transistor Ta to flow through the MOS transistor Ta, then through the MOS transistor Tc, eventually into the horizontal scanning line 104. Then, a high-level pulse is fed, as the signal φHm, to the gate of the MOS transistor Td, so that the output current fed to the horizontal scanning line 104 is fed out by way of the horizontal signal line 105 via the output terminal OUT.

Subsequently, the signal φVSn is turned to a low level, and then a high level is fed, as the signal φVRn, to the reset line 102, so that the MOS transistor Tb is turned on. As a result, the direct-current voltage VDD is fed through the MOS transistor Tb to the node between the cathode of the photodiode PD and the gate of the MOS transistor Ta, achieving resetting.

In the conventional MOS-type solid-state image-sensing device where, as shown in FIG. 14, a unit pixel is provided with an amplifying function by being provided with a MOS transistor Ta for signal amplification, the unit pixel requires, in addition to a photodiode, three or more MOS transistors. Moreover, many conductor lines need to be connected to each unit pixel to perform the outputting of an image signal and resetting alternately and to supply it with a supply voltage. These factors impose limits to the improvement of the open-area ratio and the miniaturization of the pixels.

SUMMARY OF THE INVENTION

An object of the present invention is to provide a solid-state image-sensing device that requires less transistors in and less conductor lines for each pixel and that thus permits the improvement of the open-area ratio and the miniaturization of the pixels.

To achieve the above object, according to one aspect of the present invention, a solid-state image-sensing device is provided with: a plurality of pixels arranged in a two-dimensional matrix consisting of a plurality of rows and columns; a first selector for selecting, assuming that one of the directions along the rows and along the columns is called a first direction and another a second direction, the pixels arranged in one of the lines along the first direction; a second selector for selecting the pixels arranged in one of the lines along the second direction; a controller for controlling the first and second selectors; a plurality of selection lines each connected to the pixels arranged in one of the lines along the second direction; a plurality of signal lines each connected to the pixels arranged in one of the lines along the first direction so as to receive an output signal from each pixel connected thereto; and a plurality of reset lines each connected to the pixels arranged in one of the lines along the first direction so as to feed a reset signal to each pixel connected thereto. Each pixel is provided with: a photoelectric converter for generating an electric signal commensurate to the amount of light incident thereon; a first transistor having a first electrode, a second electrode, and a control electrode, and a second transistor having a first electrode, a second electrode, and a control electrode. The first transistor has the first electrode thereof connected to the corresponding one of the selection lines, has the second electrode thereof connected to the corresponding one of the signal lines, and receives at the control electrode thereof an output signal from the photoelectric converter. The second transistor has the first electrode thereof connected to the corresponding one of the selection lines, has the second electrode thereof connected to the control electrode of the first transistor, and has the control electrode thereof connected to the corresponding one of the reset lines.

According to another aspect of the present invention, a solid-state image-sensing device is provided with: a plurality of pixels arranged in a two-dimensional matrix consisting of a plurality of rows and columns; a first selector for selecting, assuming that one of the directions along the rows and along the columns is called a first direction and another a second direction, the pixels arranged in one of the lines along the first direction; a second selector for selecting the pixels arranged in one of the lines along the second direction; a controller for controlling the first and second selectors; a plurality of selection lines each connected to the pixels arranged in one of the lines along the second direction; and a plurality of signal lines each connected to the pixels arranged in one of the lines along the first direction so as to receive an output signal from each pixel connected thereto. Each pixel is provided with: a photoelectric converter for generating an electric signal commensurate to the amount of light incident thereon; and an amplifying transistor having a first electrode, a second electrode, and a control electrode. The amplifying transistor has the first electrode thereof connected to the corresponding one of the selection lines, has the second electrode thereof connected to the corresponding one of the signal lines, and receives at the control electrode thereof an output signal from the photoelectric converter. Here, a pixel from which to output a signal is selected as a result of the first selector selecting one of the selection lines and the second selector selecting one of the signal lines, and, at the moment when a pixel is so selected, the pixel produces an output signal commensurate to the amount of light incident on the photoelectric converter and the output signal is output to the corresponding signal line.

BRIEF DESCRIPTION OF THE DRAWINGS

This and other objects and features of the present invention will become clear from the following description, taken in conjunction with the preferred embodiments with reference to the accompanying drawings in which:

FIG. 1 is a block circuit diagram showing the internal configuration of the solid-state image-sensing device of a first embodiment of the invention;

FIG. 2 is a block circuit diagram showing the internal configuration of the amplifier circuit provided in the output stage of a solid-state image-sensing device embodying the invention;

FIG. 11 is a block circuit diagram showing still another example of the internal configuration of each pixel, so configured as to perform logarithmical conversion, provided in the solid-state image-sensing device of a fourth embodiment of the invention;

FIG. 12 is a block circuit diagram showing the internal configuration of each pixel, so configured as to perform logarithmical conversion, provided in the solid-state image-sensing device of a fifth embodiment of the invention;

FIG. 13 is a block circuit diagram showing the internal configuration of the solid-state image-sensing device of a sixth embodiment of the invention.

DESCRIPTION OF THE PREFERRED EMBODIMENTS

Figure 3:
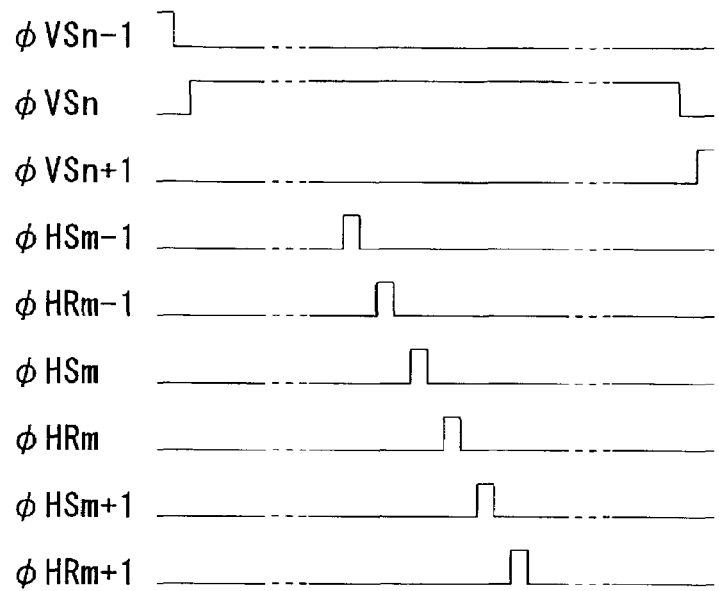
FIG. 3 is a timing chart showing the operation of the solid-state image-sensing device of the first embodiment.

Hereinafter, embodiments of the present invention will be described with reference to the drawings.

First Embodiment

A first embodiment of the invention will be described below with reference to the drawings. FIG. 1 is a block circuit diagram showing the internal configuration of the solid-state image-sensing device of this embodiment. It is to be noted that, in the following descriptions, for simplicity's sake, the solid-state image-sensing device shown in FIG. 1 is described as having unit pixels arranged in three rows and three columns, though it in reality has a large number of pixels. It is also to be noted that, in FIG. 1, the detailed configuration of a unit pixel is shown only for the unit pixel located in the nth row and mth column. In the following descriptions, the relationship of this unit pixel in the nth row and mth column with other circuit blocks and signal lines will be explained.

The solid-state image-sensing device shown in FIG. 1 has a vertical scanning circuit 1 that performs scanning in a first direction, specifically along the columns (in the vertical direction), by feeding, for one row after another, a signal to the gate of a MOS transistor T4 provided in each row, a horizontal scanning circuit 2 that performs scanning in a second direction, specifically along the rows (in the horizontal direction), by feeding, for one column after another, a signal to the gate of a MOS transistor T3 provided in each column, and a main controller 3 for controlling the vertical and horizontal scanning circuits 1 and 2.

The vertical and horizontal scanning circuits 1 and 2 each include a shift register, and operate on the basis of clock signals, start signals, and other signals fed to them from the main controller 3. The main controller 3 can, by specifying a scanning start address and a scanning end address with respect to each scanning circuit, read a particular partial area and resets that particular partial area. The MOS transistor T3 has its drain connected to a vertical signal line 5, and has its source connected to a horizontal signal line 8. The MOS transistor T4 has its drain connected to a supply voltage line 9 to receive a direct-current voltage VDD, and has its source connected to a vertical selection line 7.

This solid-state image-sensing device has a plurality of unit pixels arranged in a matrix. Each unit pixel is composed of a photodiode PD functioning as a photoelectric conversion element (this photodiode PD corresponds to a photoelectric converter that performs photoelectric conversion and electric charge accumulation), a MOS transistor T1, for signal amplification, having its gate connected to the cathode of the photodiode PD, and a MOS transistor T2, for resetting, having its source connected to the node between the photodiode PD and the gate of the MOS transistor T1. Within each unit pixel, the drains of the MOS transistors T1 and T2 are connected to the vertical selection line 7, and the source of the MOS transistor T1 is connected to the vertical signal line 5. The anode of the photodiode PD is grounded. The gate of the MOS transistor T2 is connected to a horizontal reset line 6, by way of which it receives a reset signal from the horizontal scanning circuit 2.

In the solid-state image-sensing device configured as described above, the MOS transistors T1 to T4 are each an N-channel MOS transistor formed on a p-type substrate or p-type well layer. The vertical scanning circuit 1 feeds a signal φVSn to the gate of the MOS transistor T4 of each row, and the horizontal scanning circuit 2 feeds a signal φHSm to the gate of the MOS transistor T3 of each column. Moreover the horizontal scanning circuit 2 feeds, by way of the horizontal reset line 6, a signal φHRm to the unit pixel located in the nth row and mth column.

In addition, in this solid-state image-sensing device, as shown in FIG. 2, an amplifier circuit is provided to amplify the signal output from each pixel to the horizontal signal line 8. This makes it possible to obtain an image signal as a voltage signal. This amplifier circuit is composed of a MOS transistor Q, serving as a load, having its drain connected to the horizontal signal line 8 and receiving at its gate a direct-current voltage VGG and an amplifier A that amplifies the voltage appearing at the drain of the MOS transistor Q. The output from the amplifier A is fed out, as a voltage signal, via an output terminal OUT. That is, the image signal output as a current signal from each pixel is converted into a voltage signal by the MOS transistor Q, is then amplified by the amplifier A, and is then fed out. The source of the MOS transistor Q is grounded.

Now, an example of how the solid-state image-sensing device configured as described above operates will be described with reference to FIG. 3. FIG. 3 is a timing chart showing the operation of the solid-state image-sensing device of this embodiment. For the purpose of illustrating the operation of each pixel within the solid-state image-sensing device, FIG. 3 shows the signal φVSn along with the signals preceding and succeeding it, namely φVSn−1 to φVSn+1, and the signals φHSm and φHRm along with the signals preceding and succeeding them, namely φHSm−1 to φHSm+1 and φHRm−1 to φHRm+1. That is, the operation of the solid-state image-sensing device will be described below taking up the operation of the pixel in the nth row and mth column as a representative.

The vertical scanning circuit 1 feeds a pulse signal to one row after another, starting with the signal φVS1. When, as shown in FIG. 3, the signal φVSn−1 fed to the MOS transistor T4 located in the (n−1)th row turns to a low level, the pulse signal φVSn is fed from the vertical scanning circuit 1 to the gate of the MOS transistor T4 located in the nth row. This turns the MOS transistor T4 on, and thus the direct-current voltage VDD supplied by way of the supply voltage line 9 is applied, through the MOS transistor T4 and by way of the vertical selection line 7, to the drains of the MOS transistors T1 and T2 of each pixel located in the nth row.

Then, while the signal φVSn is at a high level, the horizontal scanning circuit 2 feeds pulse signals to the pixels arranged in one column after another, starting with the signals φHS1 and φHR1. Here, the horizontal scanning circuit 2 outputs the pulse signals in the order φHS1, φHR1, φHS2, φHR2, φHS3, an so forth.

When, as shown in FIG. 3, the signal φHSm−1 is fed to the MOS transistor T3 located in the (m−1)th column, the MOS transistor T3 turns on, and thus the vertical signal line 5 of the (m−1)th column is electrically connected to the horizontal signal line 8. As a result, the voltage ascribable to the photoelectric charge accumulated in the photodiode PD in the pixel located in the nth row and (m−1)th column is fed to the gate of the MOS transistor T1, and thus an amplified current commensurate to that voltage flows through the MOS transistor T1, then through the MOS transistor T3, and then by way of the vertical signal line 5 so as to be output to the horizontal signal line 8. This output current is converted into a voltage signal by the amplifier circuit shown in FIG. 2, and is then fed out via the output terminal OUT.

In this way, when the pulse signal φHSm−1 is fed to the pixel located in the nth row and (m−1)th column, the image signal from this pixel is fed out. Subsequently, the pulse signal φHRm−1 is fed by way of the horizontal reset line 6 of the (m−1)th column to the pixel located in the nth row and (m−1)th column. This makes the MOS transistor T2 in this pixel on, and thus the node between the gate of the MOS transistor T1 and the cathode of the photodiode PD is electrically connected to the supply voltage line 9, achieving resetting.

When the signal φHRm−1 turns to a low level, then the pulse signal φHSm is fed to the gate of the MOS transistor T3 located in the mth column, and thus the image signal current-amplified by the MOS transistor T1 in the pixel located in the nth row and mth column is output through the MOS transistor T3 and by way of the vertical signal line 5 and the horizontal signal line 8. Subsequently, the pulse signal φHRm is fed by way of the horizontal reset line 6 to the gate of the MOS transistor T2 of the pixel located in the nth row and mth column, so that the node between the gate of the MOS transistor T1 and the cathode of the photodiode PD is reset by way of the vertical selection line 7 and through the MOS transistors T2 and T4. When this signal φHRm turns to a low level, the horizontal scanning circuit 2 feeds the pulse signal φHSm+1 to the MOS transistor T3 located in the (m+1)th row, and then feeds the pulse signal φHRm+1 to the pixel located in the nth row and (m+1)th row.

In this way, while the signal φVSn is at a high level, by feeding pulse signals, in the order φHS1, φHR1, φHS2, φHR2, φHS3, an so forth, to the pixels arranged in each column, the image signals from all the pixels arranged in the nth row are serially output by way of the horizontal signal line 8, and the state of each of those pixels is reset. After the image signals from all the pixels arranged in the nth row are output, the signal φVSn is turned to a low level, and then the signal φVSn+1 is turned to a high level, so that the image signals from all the pixels arranged in the (n+1)th row are read out. Thus, every time the vertical scanning circuit 1 outputs a pulse signal in the order φVS1, φVS2, and so forth, a sequence of operation as shown in FIG. 3 and described above is repeated, so that the image signals from all the pixels within the solid-state image-sensing device are output and all the pixels are reset.

In this way, as the image signals are read out and the pixels are reset, the electrons generated by the light incident on the photodiode PD are, in each pixel, accumulated at the cathode of the photodiode PD and the gate of the MOS transistor T1 for a period of time corresponding approximately to the time required to shoot one frame. That is, the photoelectric charge integration time from resetting to reading is equal in all the pixels, and thus the obtained image signals are proportional to the integral of the amount of incident light.

Second Embodiment

Figure 4:
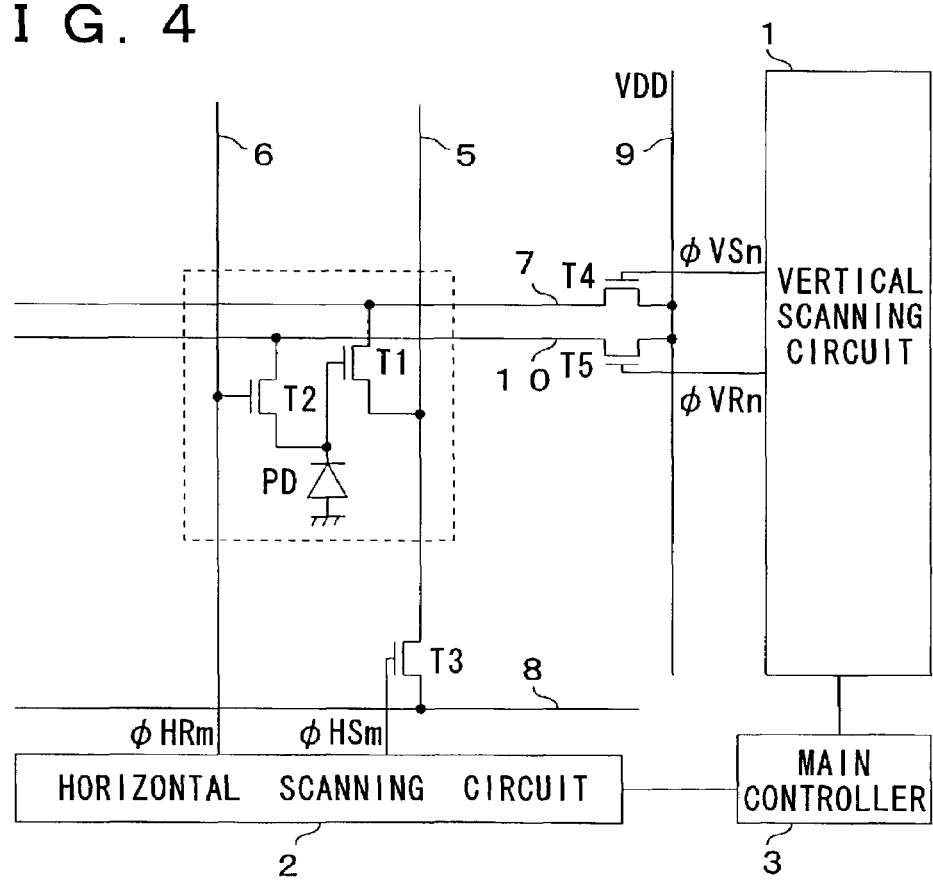
FIG. 4 is a block circuit diagram showing the internal configuration of the solid-state image-sensing device of a second embodiment of the invention.

A second embodiment of the invention will be described below with reference to the drawings. FIG. 4 is a block circuit diagram showing the internal configuration of the solid-state image-sensing device of this embodiment. It is to be noted that, for simplicity's sake, FIG. 4 shows only the configuration of the unit pixel located in the nth row and mth column and its relationship with other circuit blocks and signal lines, though the solid-state image-sensing device shown in FIG. 4, like that shown in FIG. 1, in reality has a large number of pixels. It is also to be noted that, in the solid-state image-sensing device of this embodiment, such circuit elements, signal lines, and the like as serve the same purposes as in the first embodiment (FIG. 1) are identified with the same reference numerals and symbols, and their detailed explanations will be omitted.

The solid-state image-sensing device shown in FIG. 4 is similar to that of the first embodiment in the following respects. A plurality of pixels, each composed of MOS transistors T1 and T2 and a photodiode PD, are arranged in a matrix. In each column, a MOS transistor T3 is provided that has its drain connected to a horizontal signal line 8. A vertical signal line 5 (for each column), a horizontal reset line 6 (for each column), a vertical selection line 7 (for each row), a horizontal signal line 8, and a supply voltage line 9 are provided. In each row, a MOS transistor T4 is provided that has its source connected to the supply voltage line 9. The differences from the first embodiment are as follows. In each row are additionally provided a MOS transistor T5 that has its source connected to the supply voltage line 9, and a vertical reset line 10 that is connected to the drain of the MOS transistor T5. The source of the MOS transistor T2 of each pixel is connected not to the vertical selection line 7 but to the vertical reset line 10.

Thus, the MOS transistor T5 located in the nth row receives at its gate a signal $\phi$VRn from the vertical scanning circuit 1. Otherwise, as in the first embodiment, the MOS transistors T3 and T4 receive at their gates the signals $\phi$HSm and $\phi$VSn, respectively, and the MOS transistor T2 receives at its gate the signal $\phi$HRm by way of the horizontal reset line 6.

Accordingly, when the signals $\phi$HSm and $\phi$VSn are fed to the gates of the MOS transistors T3 and T4, respectively, and thus the MOS transistors T3 and T4 turn on, an output current proportional to the integral of the amount of light incident on the photodiode PD is delivered, by way of the vertical signal line 5 and through the MOS transistor T3, to the horizontal signal line 8. The horizontal signal line 8 is provided with an amplifier circuit as shown in FIG. 2, so that the output current delivered to the horizontal signal line 8 is converted into a voltage signal and is then fed out as an image signal.

When the signal $\phi$VRn is fed to the MOS transistor T5 and the signal $\phi$HRm is fed by way of the horizontal reset line 6 to the MOS transistor T2, and thus the MOS transistors T2 and T5 turn on, the direct-current voltage VDD on the supply voltage line 9 is applied, through the MOS transistors T2 and T5 and by way of the vertical reset line 10, to the node between the gate of the MOS transistor T1 and the cathode of the photodiode PD, achieving resetting.

Figure 5:
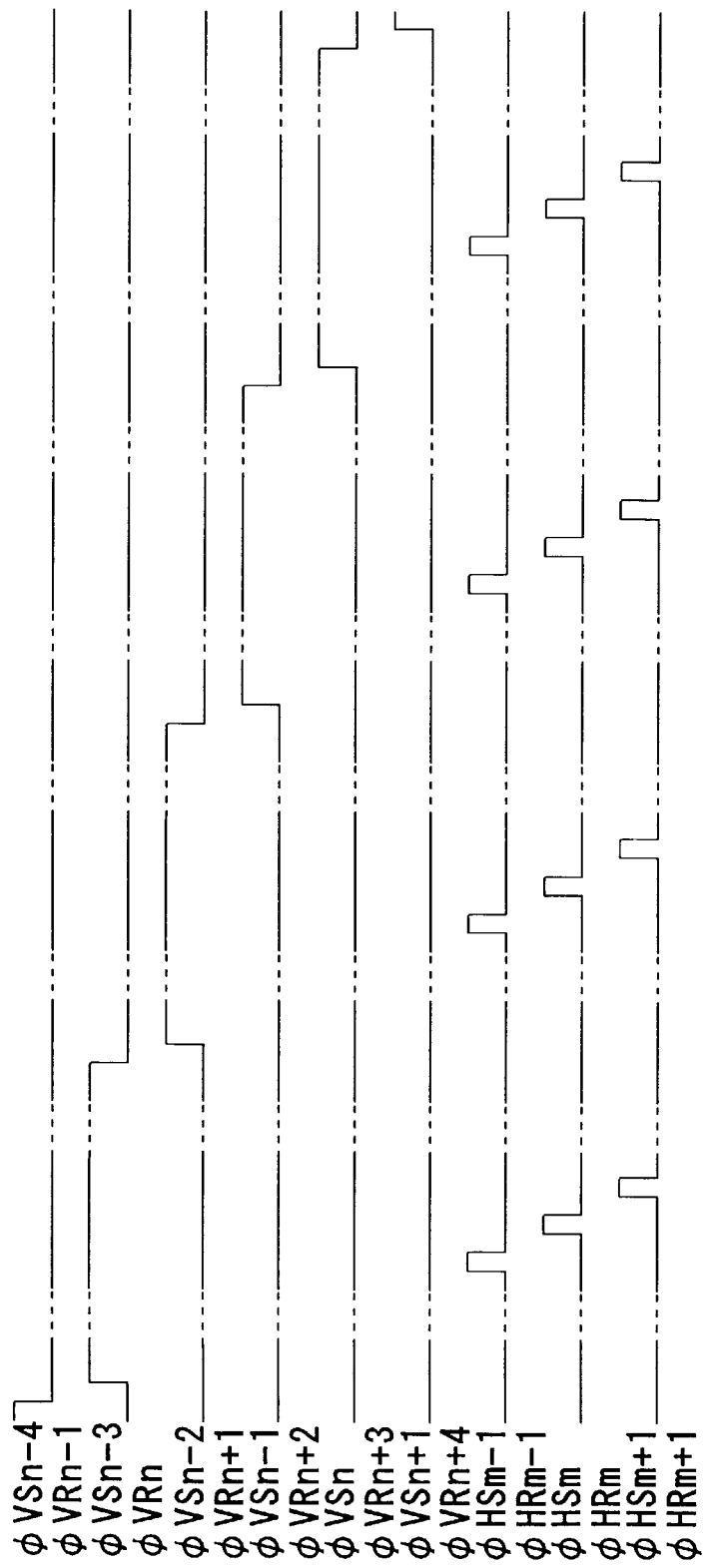
FIG. 5 is a timing chart showing the operation of the solid-state image-sensing device of the second embodiment.

Now, an example of how the solid-state image-sensing device configured as described above operates will be described with reference to FIG. 5. FIG. 5 is a timing chart showing the operation of the solid-state image-sensing device of this embedment. For the purpose of illustrating the operation of each pixel within the solid-state image-sensing device, FIG. 5 shows, as representatives, the signals $\phi$VSn and $\phi$VRn along with the signals preceding and succeeding them, namely $\phi$VSn−4 to $\phi$VSn+1 and $\phi$VRn−1 to $\phi$VRn+4, and the signals $\phi$HSm and $\phi$HRm along with the signals preceding and succeeding them, namely $\phi$HSm−1 to $\phi$HSm+1 and $\phi$HRm−1 to $\phi$HRm+1. That is, the operation of the solid-state image-sensing device will be described below taking up the operation of the pixel in the nth row and mth column as a representative.

The vertical scanning circuit 1 outputs, for the resetting of the pixels arranged in each row, a pulse signal to one row after another in the order $\phi$VR1, $\phi$VR2, and so forth, and also outputs, for the outputting of image signals, a pulse signal to one row after another in the order $\phi$VS1, $\phi$VS2, and so forth with a delay of three rows relative to the pulse signals for resetting. That is, the vertical scanning circuit 1 outputs pulse signals in such a way that, when the image signal from the pixel in the nth row is output, the pixel in the (n+3)th row is reset.

Thus, as shown in FIG. 5, when the signals $\phi$VSn−4 and $\phi$VRn−1 turn to a low level, the pulse signal $\phi$VSn−3 is fed to the gate of the MOS transistor T4 located in the (n−3)th row, and the pulse signal $\phi$VRn is fed to the gate of the MOS transistor T5 located in the nth row. As a result, the MOS transistor T5, for vertical resetting, located in the nth row turns on and the MOS transistor T4, for vertical selection, located in the (n−3)th row turns on.

Then, while the signals $\phi$VSn−3 and $\phi$VRn are at a high level, the horizontal scanning circuit 2 outputs pulse signals starting with $\phi$HS1 and $\phi$HR1. Here, the horizontal scanning circuit 2 outputs pulse signals in such a way that the resetting of the pixel in the nth row and mth column and the outputting from the pixel in the (n−3)th row and mth column are performed simultaneously; that is, as shown in FIG. 5, horizontal scanning circuit 2 outputs the signals $\phi$HSm and $\phi$HRm simultaneously. Thus, among the pixels arranged in the same column, the image signal from the pixel located in the (n−3)th row is output, and the pixel located in the nth row is reset. That is, the outputting of the image signal from the pixel in the (n−3)th row and (m−1)th column and the resetting of the pixel in the nth row and (m−1)th column are performed simultaneously, and subsequently the outputting of the image signal from the pixel in the (n−3)th row and mth column and the resetting of the pixel in the nth row and mth column are performed.

In this way, the image signal from one after another of the pixels arranged in the (n−3)th row is output, and one after another of the pixels arranged in the nth row is reset, both starting with the first column. Subsequently, the signals $\phi$VSn−3 and $\phi$VRn turn to a low level, and then the pulse signals $\phi$VSn−2 and $\phi$VRn+1 are fed. Then, as when the signals $\phi$VSn−3 and $\phi$VRn were fed, the horizontal scanning circuit 2 outputs pulse signals, starting with $\phi$HS1 and φHR1, to the pixel located in each column. Thus, among the pixels arranged in the same column, starting with the first column, the image signal from the pixel located in the (n−2)th row is output, and the pixel located in the (n+1)th row is reset.

Every time the vertical scanning circuit 1 outputs a pulse signal in the order φVS1, φVS2, and so forth, a sequence of operation as shown in FIG. 5 and described above is repeated, so that the image signals from all the pixels within the solid-state image-sensing device are output one after another while, three rows below, the pixels are reset one after another. This makes the photoelectric charge integration time from resetting to reading equal to three horizontal periods and equal in all the pixels, and thus makes it possible to obtain image signals proportional to the integral of the amount of incident light. It is to be noted that, in the present specification, a horizontal period denotes the period of time that elapses from the signal reading from the pixel in a particular column in a given row to the signal reading from the pixel in the same column in the next row, or from the resetting of the pixel in a particular column in a given row to the resetting of the pixel in the same column in the next row.

It is to be understood that FIG. 5 merely shows one example of the operation of the solid-state image-sensing device of this embodiment. For example, the operation may be modified in such a way that, while the signal φVRn+1 is fed, the signal φVSn−1 is fed. In that case, the integration time is equal to two horizontal periods. That is, by varying the timing with which the signals φVRn and φVSn are fed, the photoelectric charge integration time from resetting to reading of each pixel can be adjusted to the desired length of time.

In FIG. 4, the signal line by way of which the signal φHSm is fed to the MOS transistor T3 is provided separately from the horizontal reset line 6. However, in the example of operation shown in FIG. 5 and described above, the signals φHSm and φHRm are fed with the same timing, and therefore they may be fed by way of a single signal line. Where the signals φHSm and φHRm are fed with the same timing, the horizontal scanning circuit 2 can operate faster.

Third Embodiment

Figure 6:
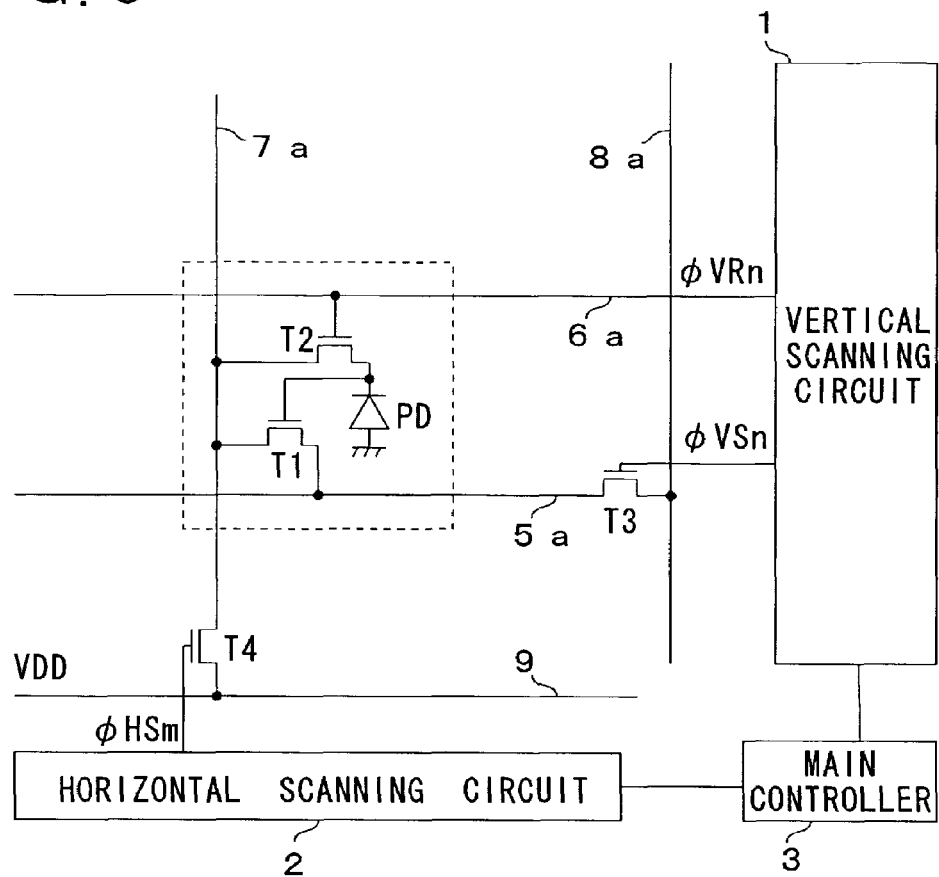
FIG. 6 is a block circuit diagram showing the internal configuration of the solid-state image-sensing device of a third embodiment of the invention.

A third embodiment of the invention will be described below with reference to the drawings. FIG. 6 is a block circuit diagram showing the internal configuration of the solid-state image-sensing device of this embodiment. It is to be noted that, for simplicity's sake, FIG. 6 shows only the configuration of the unit pixel located in the nth row and mth column and its relationship with other circuit blocks and signal lines, though the solid-state image-sensing device shown in FIG. 6, like that shown in FIG. 1, in reality has a large number of pixels. It is also to be noted that, in the solid-state image-sensing device of this embodiment, such circuit elements, signal lines, and the like as serve the same purposes as in the first embodiment (FIG. 1) are identified with the same reference numerals and symbols, and their detailed explanations will be omitted.

In the solid-state image-sensing device shown in FIG. 6, the vertical signal line 5, horizontal reset line 6, vertical selection line 7, and horizontal signal line 8 in the first embodiment are superseded by a horizontal signal line 5a, a vertical reset line 6a, a horizontal selection line 7a, and a vertical signal line 8a, respectively. Accordingly, for each row, a MOS transistor T3 is provided that has its drain connected to the horizontal signal line 5a, and, for each column, a MOS transistor T4 is provided that has its source connected to the horizontal selection line 7a. That is, in this embodiment, the direction along the columns (the vertical direction), which is the first direction in the first embodiment, is the second direction, and the direction along the rows (in the horizontal direction), which is the second direction in the first embodiment, is the first direction.

Thus, the vertical scanning circuit 1 feeds signals φVSn and φVRn respectively to the gate of the MOS transistor T3 and the vertical reset line 6a located in the nth row, and the horizontal scanning circuit 2 feeds a signal φHSm to the gate of the MOS transistor T4 located in the mth column. Moreover, as in the first embodiment, the drain of the MOS transistor T4 is connected to the supply voltage line 9 so as to receive a direct-current voltage VDD.

As in the first embodiment, a unit pixel is composed of MOS transistors T1 and T2 and a photodiode PD. The drains of the MOS transistors T1 and T2 are connected to the horizontal selection line 7a, the source of the MOS transistor T1 is connected to the horizontal signal line 5a, and the gate of the MOS transistor T2 is connected to a vertical reset line 6a.

In this way, in the solid-state image-sensing device of this embodiment, the horizontal and vertical directions are interchanged. Thus when the signals φVSn and φHSm are fed to the gates of the MOS transistors T3 and T4, an output current proportional to the integral of the amount of light incident on the photodiode PD is delivered, by way of the horizontal signal line 5a and through the MOS transistor T3, to the vertical signal line 8a. The vertical signal line 8a is provided with an amplifier circuit as shown in FIG. 2, so that the output current delivered to the vertical signal line 8a is converted into a voltage signal and is then fed out as an image signal.

When the signal φHSm is fed to the MOS transistor T4 and the signal φVRn is fed by way of the vertical reset line 6a to the MOS transistor T2, the direct-current voltage VDD on the supply voltage line 9 is applied, through the MOS transistors T2 and T4 and by way of the horizontal selection line 7a, to the node between the gate of the MOS transistor T1 and the cathode of the photodiode PD, achieving resetting.

Now, two examples of how the solid-state image-sensing device configured as described above operates will be described with reference to FIGS. 7 and 8.

1. First Example of Operation

A first example of operation will be described below with reference to FIG. 7. FIG. 7 is a timing chart showing the operation of the solid-state image-sensing device of this embodiment. For the purpose of illustrating the operation of each pixel within the solid-state image-sensing device, FIG. 7 shows, as representatives, the signals φVSn and φVRn along with the signals preceding and succeeding them, namely φVSn−1 to φVSn+1 and φVRn−1 to φVRn+1, and the signal φHSm along with the signals preceding and succeeding it, namely φHSm−1 to φHSm+1. That is, the operation of the solid-state image-sensing device will be described below taking up the operation of the pixel in the nth row and mth column as a representative.

The vertical scanning circuit 1 outputs, for the outputting of image signals, a pulse signal to one row after another in the order φVS1, φVS2, and so forth, and also outputs, for the resetting of the pixels arranged in each row, a pulse signal to one row after another in the order φVR1, φVR2, and so forth with a delay of one row relative to the pulse signals for the outputting of image signals. That is, the vertical scanning circuit 1 outputs pulse signals in such a way that, when the pixel in the nth row is reset, the image signal from the pixel in the (n+1)th row is output.

Figure 7:
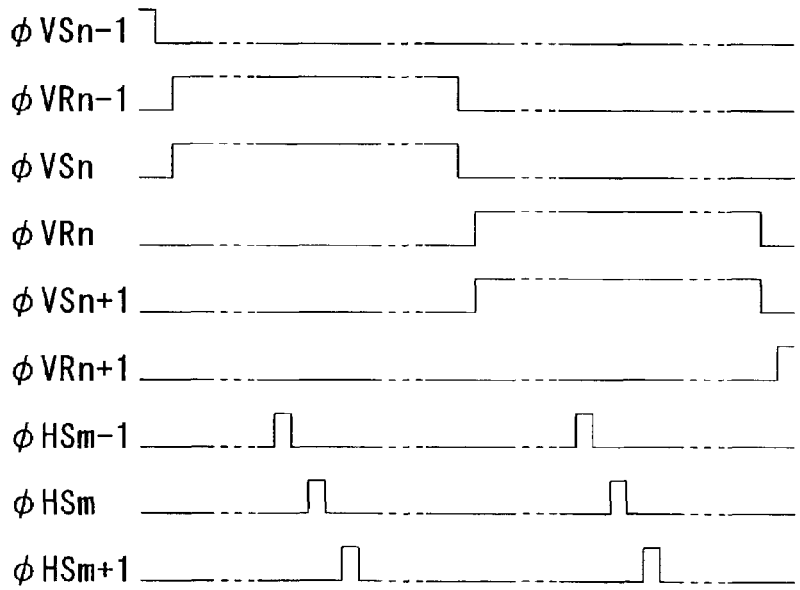
FIG. 7 is a timing chart showing the operation of the solid-state image-sensing device of the third embodiment.

Thus, as shown in FIG. 7, when the signal φVSn−1 turns to a low level, the pulse signal φVRn−1 is fed to the vertical reset line 6a located in the (n−1)th row, and the pulse signal φVSn is fed to the gate of the MOS transistor T3 located in the nth row. While these signals φVSn and φVRn−1 are at a high level, the horizontal scanning circuit 2 outputs pulse signals starting with φHS1.

When the pulse signal φHSm is fed, the direct-current voltage VDD on the supply voltage line 9 is applied, through the MOS transistor T4 and by way of the horizontal selection line 7a, to the drains of the MOS transistors T1 and T2 of the pixels arranged in the mth column. Thus, among the pixels arranged in the same column, the image signal from the pixel located in the nth row is output, and the pixel located in the (n−1)th row is reset. That is, the outputting of the image signal from the pixel in the nth row and (m−1)th column and the resetting of the pixel in the (n−1)th row and (m−1)th column are performed simultaneously, and subsequently the outputting of the image signal from the pixel in the nth row and mth column and the resetting of the pixel in the (n−1)th row and mth column are performed.

In this way, the image signal from one after another of the pixels arranged in the nth row is output, and one after another of the pixels arranged in the (n−1)th row is reset, both starting with the first column. Subsequently, the signals φVSn and φVRn−1 turn to a low level, and then the pulse signals φVSn+1 and φVRn are fed. Then, as when the signals φVSn and φVRn−1 were fed, the horizontal scanning circuit 2 outputs pulse signals, starting with φHS1, to the MOS transistor T4 located in each column. Thus, among the pixels arranged in the same column, starting with the first column, the image signal from the pixel located in the (n+1)th row is output, and the pixel located in the nth row is reset.

Every time the vertical scanning circuit 1 outputs a pulse signal in the order φVS1, φVS2, and so forth, a sequence of operation as shown in FIG. 7 is repeated, so that the image signals from all the pixels within the solid-state image-sensing device are output one after another while, one row above, the pixels are reset one after another. This makes the photoelectric charge integration time from resetting to reading equal to the period of time corresponding approximately to one frame minus one horizontal period and equal in all the pixels. Thus, it is possible to obtain image signals proportional to the integral of the amount of incident light.

It is to be understood that FIG. 7 merely shows one example of operation. For example, the operation may be modified in such a way that, while the signal φVRn+1 is fed, the signal φVSn−1 is fed. In that case, the integration time is equal to two horizontal periods. That is, by varying the timing with which the signals φVRn and φVSn are fed, the photoelectric charge integration time from resetting to reading of each pixel can be adjusted to the desired length of time.

2. Second Example of Operation

A second example of operation will be described below with reference to FIG. 8. FIG. 8 is a timing chart showing the operation of the solid-state image-sensing device of this embodiment. Like FIG. 7, FIG. 8 shows the signals φVSn and φVRn along with the signals preceding and succeeding them, namely φVSn−1 to φVSn+1 and φVRn−1 to φVRn+1, and the signal φHSm along with the signals preceding and succeeding it, namely φHSm−1 to φHSm+1. That is, the operation of the solid-state image-sensing device will be described below taking up the operation of the pixel in the nth row and mth column as a representative.

The vertical scanning circuit 1 outputs pulse signals in the order φVS1, φVR1, φVS2, φVR2, φVS3, and so forth. Thus, as shown in FIG. 8, when the signal φVRn−1 turns to a low level, the pulse signal φVSn is fed to the gate of the MOS transistor T3 located in the nth row. This turns the MOS transistor T3 in the nth row on, and thus the horizontal signal line 5a is electrically connected through the MOS transistor T3 to the vertical signal line 8a.

Then, while the signal φVSn is at a high level, the horizontal scanning circuit 2 outputs pulse signals starting with φHS1. When the φHSm is fed, the direct-current voltage VDD is applied to the drain of the MOS transistor T1 provided in the pixel in the nth row and mth column, and thus amplification is performed. As a result, the image signal from the pixel in the nth row and mth column is output to the vertical signal line 8a. In this way, starting with the first column, the image signal from one after another of the pixels arranged in the nth row is output.

After the image signal from one after another of the pixels arranged in the nth row is output, the signal φVSn turns to a low level. Subsequently, the pulse signal φVRn is fed, and, just as when the pulse signal φVSn was fed, the horizontal scanning circuit 2 outputs pulse signals to the pixel located in each column starting with the φHS1. When the φHSm is fed, the direct-current voltage VDD is applied to the drain of the MOS transistor T2 provided in the pixel in the nth row and mth column and the signal φVRn is fed to its gate. Thus, resetting is performed, and the pixel in the nth row and mth column is reset. In this way, starting with the first column, one after another of the pixels arranged in the nth row is reset.

After, in this way, starting with the first column, the image signal from one after another of the pixels arranged in the nth row is output and one after another of the pixels arranged in the nth row is reset, the signal φVRn turns to a low level, then the pulse signal φVSn+1 is fed, and then the pulse signal φVRn+1 is fed. Then, as when the pulse signals φVSn and φVRn were fed, while the pulse signals φVSn+1 and φVRn+1 are at a high level, the horizontal scanning circuit 2 outputs pulse signals, starting with φHS1, to the MOS transistor T4 located at each column. Thus, starting with the first column, the image signals from all the pixels arranged in the (n+1)th row are output one after another, and then, starting with the first column, all the pixels arranged in the (n+1)th row are reset one after another.

Figure 8:
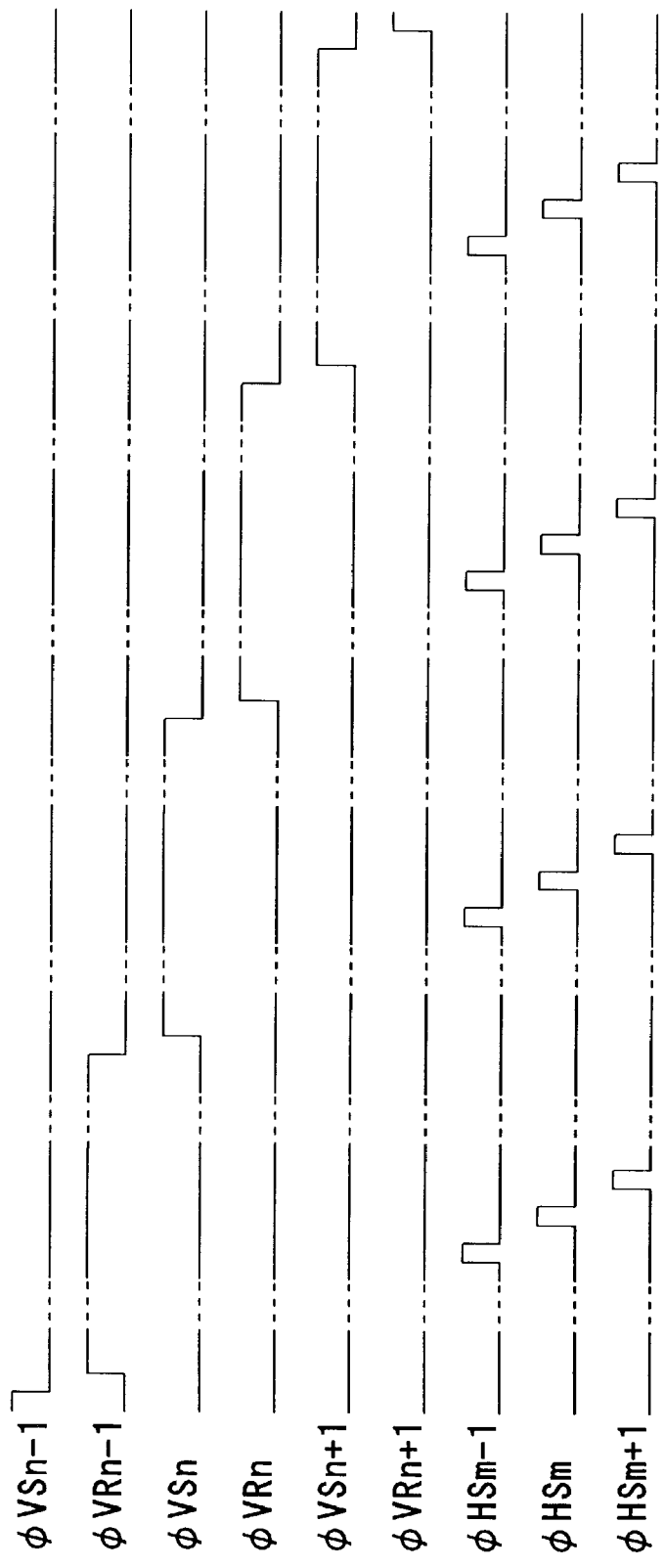
FIG. 8 is a timing chart showing another example of the operation of the solid-state image-sensing device of the third embodiment.

Every time the vertical scanning circuit 1 outputs a pulse signal in the order φVS1, φVR1, φVS2, φVR2 and so forth, a sequence of operation as shown in FIG. 8 is repeated, so that the image signal from one after another of the pixels arranged in the same row in the solid-state image-sensing device is output and then one after another of the pixels arranged in the same row is reset. This makes the photoelectric charge integration time from resetting to reading equal to the period of time corresponding approximately to one frame minus half a horizontal period and equal in all the pixels. Thus, it is possible to obtain image signals proportional to the integral of the amount of incident light.

In this way, in this example of operation, as opposed to the first example of operation, the outputting of an image signal and resetting are not performed in the same column. This makes it possible to prevent, when the outputting of an image signal and resetting are performed in the same column, the direct-current voltage level fed to the photodiode PD for resetting from affecting the image signal level of other pixels arranged in the same column as observed in the first example of operation.

It is to be understood that FIG. 8 merely shows one example of operation. For example, the operation may be modified in such a way that, after the signal φVRn+1 is fed, the signal φVSn−1 is fed. In that case, the integration time is equal to 5/2 of a horizontal period. That is, by varying the timing with which the signals φVRn and φVSn are fed, the photoelectric charge integration time from resetting to reading of each pixel can be adjusted to the desired length of time.

The solid-state image-sensing device of this embodiment is configured as a modified version of that of the first embodiment in which the horizontal and vertical directions are interchanged. However, it may be configured as a modified version of that of the second embodiment in which the horizontal and vertical directions are interchanged. In that case, the signals fed from the vertical scanning circuit 1 and the horizontal scanning circuit 2 may be controlled to behave as in the second embodiment, i.e., as shown in the timing chart of FIG. 5.

Specifically, the vertical scanning circuit 1 feeds the signals φVRn and φVSn to the gates of the MOS transistors T2 and T3, respectively, and the horizontal scanning circuit 2 feeds the signals φHSm and φHRm to the gates of the MOS transistors T4 and T5, respectively. Thus, among the pixels arranged in the row in which the MOS transistor T3 is turned on by the vertical scanning circuit 1 and those arranged in the row of which the reset line is selected, the transistors T4 and T5, respectively, located in one column after another are turned on by the horizontal scanning circuit 2. In this way, the outputting of image signals and resetting are performed successively.

Fourth Embodiment

Figure 9:
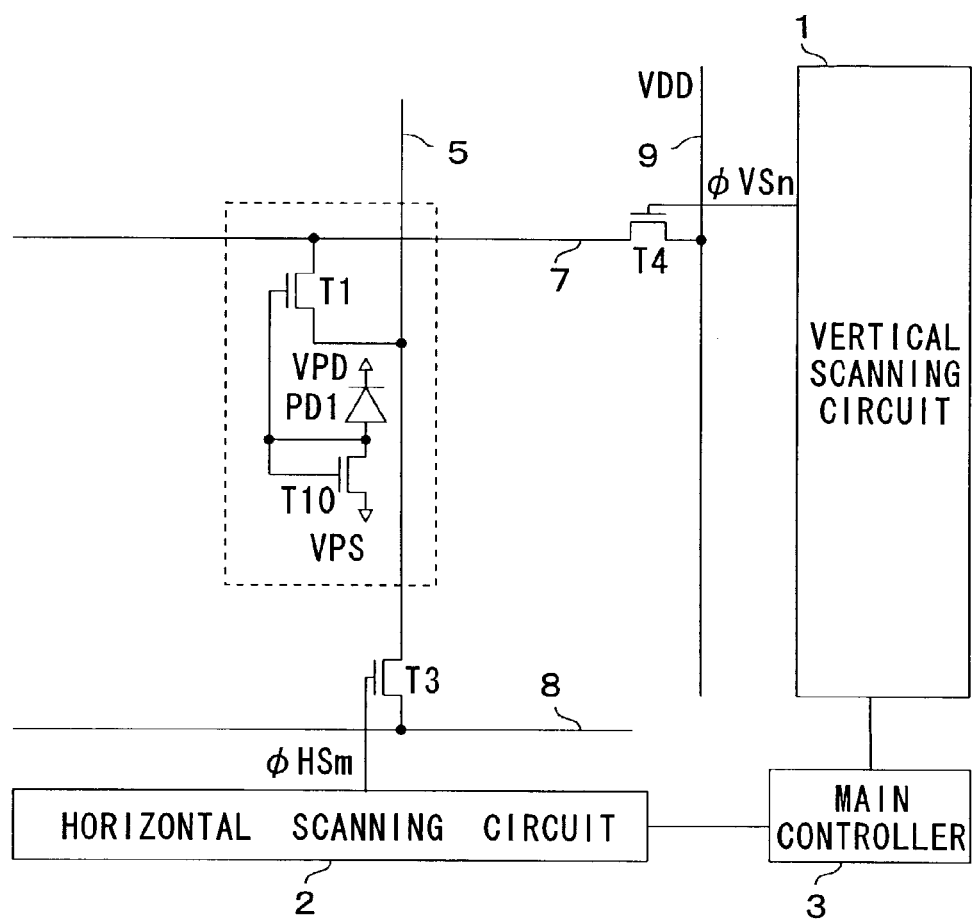
FIG. 9 is a block circuit diagram showing the internal configuration of each pixel, so configured as to perform logarithmical conversion, provided in the solid-state image-sensing device of a fourth embodiment of the invention.

A fourth embodiment of the invention will be described below with reference to the drawings. FIG. 9 is a block circuit diagram showing the internal configuration of the solid-state image-sensing device of this embodiment. It is to be noted that, for simplicity's sake, FIG. 9 shows only the configuration of the unit pixel located in the nth row and mth column and its relationship with other circuit blocks and signal lines, though the solid-state image-sensing device shown in FIG. 9, like that shown in FIG. 1, in reality has a large number of pixels. It is also to be noted that, in the solid-state image-sensing device of this embodiment, such circuit elements, signal lines, and the like as serve the same purposes as in the first embodiment (FIG. 1) are identified with the same reference numerals and symbols, and their detailed explanations will be omitted.

Whereas, in the solid-state image-sensing device of the first embodiment, each pixel outputs an output current of which the level is linearly proportional to the integral of the amount of incident light, in this embodiment, each pixel outputs an output current of which the level is logarithmically proportional to the integral of the amount of incident light. Moreover, as will be described later, in this embodiment, resetting is not required, and therefore the horizontal reset line 6 and the MOS transistor T2 found in the first embodiment are omitted. In other respects, the configuration here is the same as in the first embodiment.

The pixel shown in FIG. 9, unlike that of the solid-state image-sensing device shown in FIG. 1, has, in place of the photodiode PD, a photodiode PD1 receiving at its cathode a direct-current voltage VPD and a MOS transistor T10 having its gate and drain connected to the anode of the photodiode PD1. The photodiode PD1 and the MOS transistor T10 together function as a photoelectric converter.

Moreover, in this pixel, a direct-current voltage VPS is applied to the source of the MOS transistor T10, and the node between the gate and drain of the MOS transistor T10 and the anode of the photodiode PD1 is connected to the gate of the MOS transistor T1. The direct-current voltage VPD has a level that permits the MOS transistor T10 to operate in a subthreshold region. The MOS transistor T10 is, like the MOS transistors T1 to T4, an N-channel MOS transistor formed on a p-type semiconductor substrate or p-type well layer.

In the pixel configured as described above, when light is incident on the photodiode PD1, a photoelectric charge commensurate to the amount of incident light flows from the photodiode PD1 to the MOS transistor T10. Here, the MOS transistor T10 operates in a subthreshold region, and therefore a voltage proportional to the logarithm of the amount of incident light appears at the gates of the MOS transistors T1 and T10. This voltage appearing at the gates of the MOS transistors T1 and T10 is then current-amplified by the MOS transistor T1.

Thus, when the MOS transistors T3 and T4 turn on, according to the voltage appearing at the gate of the MOS transistor T1, an image signal of which the level is proportional to the logarithm of the amount of incident light is fed out by way of the vertical signal line 5 and the horizontal signal line 8. In this way, each pixel produces an electric signal commensurate to the amount of incident light, and this electric signal varies constantly according to the amount of incident light. Accordingly, whenever a pixel is selected, an output signal commensurate with the amount of light incident on the photodiode PD1 is output to the vertical signal line 5 and the horizontal signal line 8. Thus, the pixel does not require resetting.

Except that no resetting is required in this way, the vertical scanning circuit 1 and the horizontal scanning circuit 2 output signals with the same timing as in the first embodiment. Therefore, no timing chart is shown anew.

Figure 10:
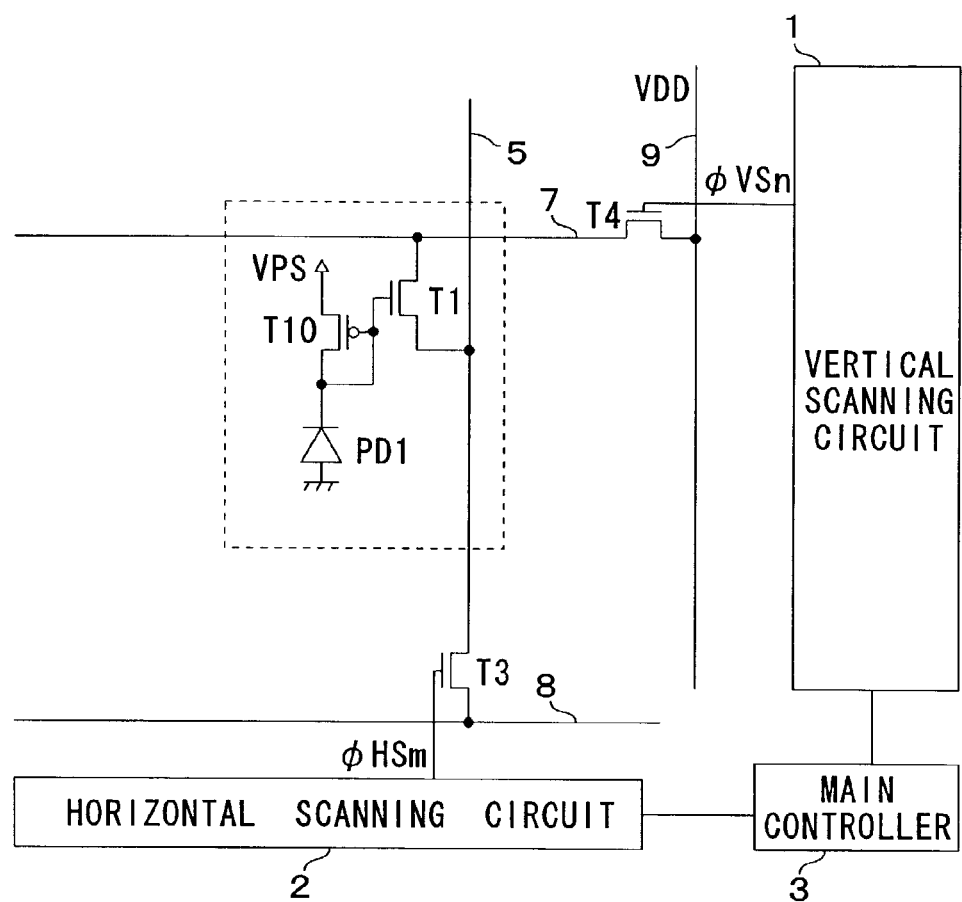
FIG. 10 is a block circuit diagram showing another example of the internal configuration of each pixel, so configured as to perform logarithmical conversion, provided in the solid-state image-sensing device of a fourth embodiment of the invention.
Figure 14:
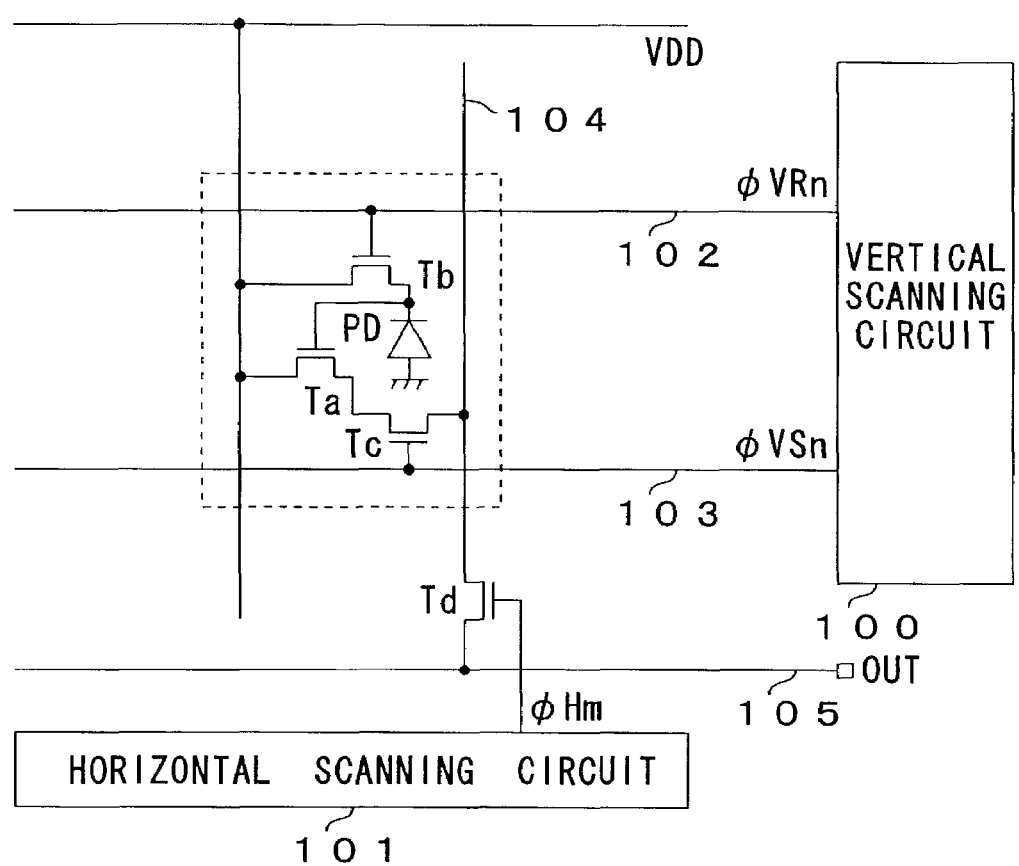
FIG. 14 a block circuit diagram showing the internal configuration of a conventional solid-state image-sensing device.

Next, a first modified example of this embodiment will be described. FIG. 10 shows an example in which the MOS transistor T10 shown in FIG. 9 is replaced with a p-channel MOS transistor. By adjusting the direct-current voltage VPS so that the MOS transistor T10 operates in a subthreshold region, a voltage proportional to the logarithm of the amount of incident light appears at the gates of the MOS transistors T1 and T10.

Next, a second modified example of this embodiment will be described. FIG. 11 shows an example in which an n-channel MOS transistor is used as the MOS transistor T10 shown in FIG. 9 but a direct-current voltage VGG is applied to its gate. By adjusting the direct-current voltage VGG, it is possible to make a voltage proportional to the logarithm of the amount of incident light appear at the gate of the MOS transistor T1.

Fifth Embodiment

A fifth embodiment of the invention will be described below with reference to the drawings. FIG. 12 is a block circuit diagram showing the internal configuration of the solid-state image-sensing device of this embodiment. It is to be noted that, for simplicity's sake, FIG. 12 shows only the configuration of the unit pixel located in the nth row and mth column and its relationship with other circuit blocks and signal lines, though the solid-state image-sensing device shown in FIG. 12, like that shown in FIG. 4, in reality has a large number of pixels. It is also to be noted that, in the solid-state image-sensing device of this embodiment, such circuit elements, signal lines, and the like as serve the same purposes as in the second embodiment (FIG. 4) are identified with the same reference numerals and symbols, and their detailed explanations will be omitted.

Just as the solid-state image-sensing device of the fourth embodiment (FIG. 9) is to that of the first embodiment (FIG. 1), so the solid-state image-sensing device of this embodiment is to that of the second embodiment. Specifically, whereas, in the second embodiment, each pixel outputs an output current of which the level is linearly proportional to the integral of the amount of incident light, in this embodiment, each pixel outputs an output current of which the level is logarithmically proportional to the integral of the amount of incident light. Thus, here, the vertical scanning circuit 1 and the horizontal scanning circuit 2 output signals with the same timing as in the second embodiment, and therefore only the configuration of the pixel used in this embodiment will be described below.

The pixel shown in FIG. 12, unlike that of the solid-state image-sensing device shown in FIG. 1, has, in place of the photodiode PD, a photodiode PD2 having its anode grounded, a MOS transistor T11 having its gate and drain connected to the cathode of the photodiode PD2, a MOS transistor T12 having its gate connected to the node between the anode of the photodiode PD2 and the gate and drain of the MOS transistor T11, and a capacitor C connected between the drain and source of the MOS transistor T12. The photodiode PD2, the MOS transistors T11 and T12, and the capacitor C together function as a photoelectric converter that performs photoelectric conversion and electric charge accumulation.

Moreover, in this pixel, a direct-current voltage VPS is applied by way of a supply voltage line 11, and the node between the source of the MOS transistor T12 and the capacitor C is grounded. The node between the drain of the MOS transistor T12 and the capacitor C is connected to the node between the gate of the MOS transistor T1 and the source of the MOS transistor T2. The direct-current voltage VPS has a level that permits the MOS transistor T10 to operate in a subthreshold region. The MOS transistors T11 and T12 are each a P-channel MOS transistor formed on an n-type semiconductor substrate or n-type well layer.

In the pixel configured as described above, when light is incident on the photodiode PD2, a photoelectric current commensurate to the amount of incident light flows from the photodiode PD2 to the MOS transistor T11. Here, the MOS transistor T11 operates in a subthreshold region, and therefore a voltage proportional to the logarithm of the amount of incident light appears at the gates of the MOS transistors T11 and T12. As a result, an electric charge of which the amount is logarithmically proportional to the integral of the photoelectric current flowing through the photodiode PD2 is accumulated in the capacitor C (for details, refer to U.S. Pat. No. 5,241,575).

Thus, when the MOS transistors T3 and T4 turn on, a voltage of which the level is logarithmically proportional to the integral of the amount of incident light is current-amplified by the MOS transistor T1, and is fed out, as an image signal, by way of the vertical signal line 5 and the horizontal signal line 8. On the other hand, when the MOS transistor T5 is on, the MOS transistor T2 is on, and thus the potential at the capacitor C is reset.

Sixth Embodiment

A sixth embodiment of the invention will be described below with reference to the drawings. FIG. 13 is a block circuit diagram showing the internal configuration of the solid-state image-sensing device of this embodiment. It is to be noted that, for simplicity's sake, FIG. 13 shows only the configuration of the unit pixel located in the nth row and mth column and its relationship with other circuit blocks and signal lines, though the solid-state image-sensing device shown in FIG. 13, like that shown in FIG. 6, in reality has a large number of pixels. It is also to be noted that, in the solid-state image-sensing device of this embodiment, such circuit elements, signal lines, and the like as serve the same purposes as in the third or fifth embodiment (FIG. 6 or 12) are identified with the same reference numerals and symbols, and their detailed explanations will be omitted.

In this embodiment, the solid-state image-sensing device is provided with pixels of which each has a construction similar to that used in the fifth embodiment; specifically, each pixel is composed of MOS transistors T1, T2, T11, and T12, a photodiode PD2, and a capacitor C. That is, just as the solid-state image-sensing device of the fifth embodiment is to that of the second embodiment, so the solid-state image-sensing device of this embodiment is to that of the third embodiment. Specifically, in this embodiment, instead of the photodiode PD, a photoelectric converter composed of the photodiode PD2, the MOS transistors T11 and T12, and the capacitor C is provided to perform photoelectric conversion and electric charge accumulation. Thus, the vertical scanning circuit 1 and the horizontal scanning circuit 2 output signals with the same timing as in the third embodiment, and the pixels are configured in the same manner and operate in the same manner as in the fifth embodiment.

In the solid-state image-sensing device configured as described above, when the MOS transistors T2 and T4 are turned on, the voltage at the node between the MOS transistor T12 and the capacitor C is reset. Then, a predetermined period of time after the MOS transistors T2 and T4 are turned off, the MOS transistors T3 and T4 are turned on, so that a voltage appearing at the node between the source of the MOS transistor T12 and the capacitor C, of which the level is logarithmically proportional to the integral of the amount of incident light, is current-amplified by the MOS transistor T1, and is fed out, as an image signal, by way of the horizontal signal line 5a and the vertical signal line 8a.

In the first to sixth embodiments, the main controller 3 feeds a clock to each of the vertical scanning circuit 1 and the horizontal scanning circuit 2 so that signals are fed to one pixel after another. Instead, it is also possible to determine, in the main controller 3, from which pixel position to output an image signal and feed control signals to the vertical scanning circuit 1 and horizontal scanning circuit 2 so that the signals output from the vertical scanning circuit 1 and the horizontal scanning circuit 2 are controlled in such a way that the image signal is output from the thus determined pixel position.

In the first to fourth embodiments, all the MOS transistors are N-channel MOS transistors. However, it is also possible to use, instead, MOS transistors of the opposite polarity, i.e., P-channel MOS transistors. In that case, their interconnection is partially modified, and the polarities of the voltages applied to the individual circuit elements are reversed; however, even then, the overall configuration and operation remain essentially the same.

Likewise, in the fifth and sixth embodiments, each of the MOS transistors provided within the solid-state image-sensing device may be replaced with a MOS transistor of the opposite polarity so that the MOS transistors T1 to T5 are P-channel MOS transistors and the MOS transistors T11 and T12 are N-channel MOS transistors. In that case, their interconnection is partially modified, and the polarities of the voltages applied to the individual circuit elements are reversed; however, even then, the overall configuration and operation remain essentially the same.

The photoelectric converter in each pixel may be realized not only as a photodiode PD alone, a circuit composed of a photodiode PD1 and a MOS transistor T10, or a circuit composed of a photodiode PD2, MOS transistors T11 and T12, and a capacitor C, but also as a circuit having any other configuration as long as it operates similarly.

According to the present invention, each pixel is composed of a photoelectric converter and two transistors. Thus, as compared with a conventional solid-state image-sensing device of which each pixel has, in addition to a photoelectric converter, at least three transistors, it is possible to miniaturize the pixels. Accordingly, it is possible to reduce the number of conductor lines, such as supply power lines and signal lines, connected to each pixel, and thereby reduce the area required for wiring. Through such miniaturization of pixels and reduction of wiring, it is possible to improve the open-area ratio and increase the density of the pixels arranged. Moreover, it is possible to perform, for a given pixel, resetting and the outputting of an image signal with different timing, and thus it is possible to make the integration time in the photoelectric converter equal in all the pixels.

Alternatively, each pixel is composed of a photoelectric converter that produces an output logarithmically proportional to the amount of incident light and one transistor. Thus, as compared with a conventional solid-state image-sensing device, it is possible to miniaturize the pixels. Moreover, it is possible to reduce the area required for wiring. Thus, it is possible to improve the open-area ratio, and to increase the density of the pixels arranged.

What is claimed is:

1. A solid-state image-sensing device comprising:
    a plurality of pixels arranged in a two-dimensional matrix consisting of a plurality of rows and columns;
    a first selector for selecting, assuming that one of directions along the rows and along the columns is called a first direction and another a second direction, pixels arranged in one of the lines along the first direction;
    a second selector for selecting pixels arranged in one of the lines along the second direction;
    a controller for controlling the first and second selectors;
    a plurality of selection lines each connected to the pixels arranged in one of the lines along the second direction;
    a plurality of signal lines each connected to the pixels arranged in one of the lines along the first direction so as to receive an output signal from each pixel connected thereto; and
    a plurality of reset lines each connected to the pixels arranged in one of the lines along the first direction so as to feed a reset signal to each pixel connected thereto;
    wherein each pixel comprises:
    a photoelectric converter for generating an electric signal commensurate to an amount of light incident thereon;
    a first transistor having a first electrode, a second electrode, and a control electrode, the first transistor having the first electrode thereof connected to a corresponding one of the selection lines, having the second electrode thereof connected to a corresponding one of the signal lines, and receiving at the control electrode thereof an output signal from the photoelectric converter; and
    a second transistor having a first electrode, a second electrode, and a control electrode, the second transistor having the first electrode thereof connected to a corresponding one of the selection lines, having the second electrode thereof connected to the control electrode of the first transistor, and having the control electrode thereof connected to a corresponding one of the reset lines.

2. A solid-state image-sensing device as claimed in claim 1, wherein the controller controls the first selector such that the first selector selects the plurality of selection lines one after another in the first direction, and the controller controls the second selector such that, when one of the selection lines is being selected by the first selector, the second selector selects the plurality of signal lines one after another in the second direction and also selects the plurality of reset signals one after another in the second direction.

3. A solid-state image-sensing device as claimed in claim 2, wherein the second selector selects with different timing the signal line and the reset line connected to each of the pixels arranged in one of the lines along the first direction.

4. A solid-state image-sensing device as claimed in claim 3, wherein the second selector selects the plurality of signal lines and the plurality of reset lines alternately.

5. A solid-state image-sensing device as claimed in claim 1, wherein the controller controls the second selector such that the second selector selects the signal lines one after another and the reset lines one after another in the second direction and that the second selector selects with different timing the signal line and the reset line connected to each of the pixels arranged in one of the lines along the first direction, and the controller controls the first selector such that, when one of the signal lines is being selected by the second selector, the first selector selects the selection lines one after another in the first direction and that, when one of the reset lines is being selected by the second selector, the first selector selects the selection lines one after another in the first direction.

6. A solid-state image-sensing device as claimed in claim 5, wherein the signal line connected to the pixels arranged in a first line along the first direction is selected with the same timing as the reset line connected to the pixels arranged in a second line, different from the first line, along the first direction.

7. A solid-state image-sensing device as claimed in claim 5, wherein the timing with which one of the signal lines is selected does not overlap with the timing with which one of the reset lines is selected.

8. A solid-state image-sensing device as claimed in claim 1, wherein the selection lines include, for each line along the second direction, a first selection line and a second selection line, the first selection line being connected to the first electrode of the first transistor of each of the pixels arranged in the corresponding line along the second direction, the second selection line being connected to the first electrode of the second transistor of each of the pixels arranged in the corresponding line along the second direction.

9. A solid-state image-sensing device as claimed in claim 8,
wherein the controller controls the first selector such that the first selector selects the plurality of first selection lines one after another and the plurality of second selection lines one after another in the first direction and that the first selector selects the first selection line connected to the pixels arranged in a first line along the second direction with same timing as the second selection line connected to the pixels arranged in a second line along the second direction, and
the controller controls the second selector such that the second selector selects the signal lines one after another and the reset lines one after another in the second direction and that the second selector selects the signal line connected to the pixels arranged in a third line along the first direction with the same timing as the reset line connected to the pixels arranged in a fourth line along the first direction.

10. A solid-state image-sensing device as claimed in claim 8,
wherein the controller controls the second selector such that, when one of the first selection lines and one of the second selection lines are being selected by the first selector, the second selector selects the signal lines one after another and the reset lines one after another in the second direction.

11. A solid-state image-sensing device as claimed in claim 8,
wherein the controller controls the first selector such that, when one of the signal lines and one of the reset lines are being selected by the second selector, the first selector selects the first selection lines one after another and the second selection lines one after another in the first direction.

12. A solid-state image-sensing device as claimed in claim 1,
wherein the photoelectric converter has such characteristics as to produce an electric signal that varies linearly in proportion to the amount of incident light.

13. A solid-state image-sensing device as claimed in claim 1,
wherein the photoelectric converter has such characteristics as to produce an electric signal that varies logarithmically in proportion to the amount of incident light.

14. A solid-state image-sensing device as claimed in claim 1,
wherein each pixel further comprises:
a capacitor for accumulating a signal electric charge corresponding to the output signal output from the pixel to a corresponding one of the signal lines.

15. A solid-state image-sensing device as claimed in claim 1,
wherein each pixel includes two transistors.

16. A solid-state image-sensing device comprising:
a plurality of pixels arranged in a two-dimensional matrix consisting of a plurality of rows and columns;
a first selector for selecting, assuming that one of directions along the rows and along the columns is called a first direction and another a second direction, pixels arranged in one of the lines along the first direction;
a second selector for selecting pixels arranged in one of the lines along the second direction;
a controller for controlling the first and second selectors;
a plurality of selection lines each connected to the pixels arranged in one of the lines along the second direction; and
a plurality of signal lines each connected to the pixels arranged in one of the lines along the first direction so as to receive an output signal from each pixel connected thereto,
wherein each pixel comprises:
a photoelectric converter for generating an electric signal commensurate to an amount of light incident thereon; and
an amplifying transistor having a first electrode, a second electrode, and a control electrode, the amplifying transistor having the first electrode thereof connected to a corresponding one of the selection lines, having the second electrode thereof connected to a corresponding one of the signal lines, and receiving at the control electrode thereof an output signal from the photoelectric converter,
wherein a pixel from which to output a signal is selected as a result of the first selector selecting one of the selection lines and the second selector selecting one of the signal lines, and, at a moment when a pixel is so selected, the pixel produces an output signal commensurate to the amount of light incident on the photoelectric converter and the output signal is output to the corresponding signal line.

17. A solid-state image-sensing device as claimed in claim 16,
wherein the photoelectric converter has such characteristics as to produce an electric signal proportional to a logarithm of the amount of incident light.

18. A solid-state image-sensing device as claimed in claim 16, further comprising:
a supply voltage line for supplying a predetermined voltage to the selection lines;
a plurality of first switches, one provided for each of the selection lines, for electrically connecting and disconnecting the supply voltage line to and from the selection lines;
an output line to which output signals are fed from the signal lines; and
a plurality of second switches, provided one for each of the signal lines, for electrically connecting and disconnecting the output line to and from the signal lines;
wherein the plurality of first switches are controlled by the first selector and the plurality of second switches are controlled by the second selector.

19. A solid-state image-sensing device as claimed in claim 18,
wherein the first and second switches are each composed of a transistor having a first electrode, a second electrode, and a control electrode, the transistors constituting the first switches receiving at the control electrodes thereof control signals from the first selector and the transistors constituting the second switches receiving at the control electrodes thereof control signals from the second selector.

* * * * *